US012486591B2

(12) United States Patent
Li

(10) Patent No.: US 12,486,591 B2
(45) Date of Patent: Dec. 2, 2025

(54) ACQUISITION EQUIPMENT AND METHOD FOR ACQUIRING NITROGEN-DOPED SILICON MELT AND MANUFACTURING SYSTEM OF NITROGEN-DOPED MONOCRYSTALLINE SILICON

(71) Applicant: XI'AN ESWIN MATERIAL TECHNOLOGY CO., LTD., Xi'an (CN)

(72) Inventor: Yang Li, Xi'an (CN)

(73) Assignee: XI'AN ESWIN MATERIAL TECHNOLOGY CO., LTD., Xi'an (CN)

( * ) Notice: Subject to any disclaimer, the term of this patent is extended or adjusted under 35 U.S.C. 154(b) by 0 days.

(21) Appl. No.: 18/253,757

(22) PCT Filed: Sep. 20, 2022

(86) PCT No.: PCT/CN2022/119905

§ 371 (c)(1),
(2) Date: May 19, 2023

(87) PCT Pub. No.: WO2023/045924

PCT Pub. Date: Mar. 30, 2023

(65) Prior Publication Data

US 2024/0011182 A1 Jan. 11, 2024

(30) Foreign Application Priority Data

Sep. 23, 2021 (CN) .......................... 202111115707.3

(51) Int. Cl.
*C30B 15/04* (2006.01)
*C30B 15/10* (2006.01)
*C30B 29/06* (2006.01)

(52) U.S. Cl.
CPC .............. *C30B 15/04* (2013.01); *C30B 15/10* (2013.01); *C30B 29/06* (2013.01)

(58) Field of Classification Search
CPC .......... C30B 15/04; C30B 15/10; C30B 29/06
See application file for complete search history.

(56) References Cited

U.S. PATENT DOCUMENTS 5,178,840 A * 1/1993 Geyling .................. C30B 29/06 117/933
2001/0007240 A1 7/2001 Dietze et al.
(Continued)

FOREIGN PATENT DOCUMENTS

CN 102146582 A 8/2011
CN 102168312 A 8/2011
(Continued)

OTHER PUBLICATIONS

Japanese Office Action corresponding to Japanese Application No. 2022-571858, dated Jul. 9, 2024. (2 pages).
(Continued)

*Primary Examiner* — Robert M Kunemund
(74) *Attorney, Agent, or Firm* — Maginot, Moore & Beck LLP

(57) ABSTRACT

Embodiments of the present disclosure disclose an acquisition equipment and a method for acquiring a nitrogen-doped silicon melt, and a system for manufacturing a nitrogen-doped monocrystalline silicon. The acquisition equipment comprises: a granulation apparatus, which is configured to prepare a plurality of polysilicon particles with uniform particles sizes using polysilicon feedstock blocks; a reaction apparatus, which is configured to enable the plurality of polysilicon particles and nitrogen gas to be subjected to chemical reaction to obtain a plurality of reaction particles, wherein silicon nitride is formed in surface layer of each of the plurality of polysilicon particles by the chemical reaction
(Continued)

such that each of the plurality of reaction particles includes a polysilicon core and a silicon nitride coating on the polysilicon core; a melting apparatus, which is configured to melt the plurality of reaction particles to obtain the nitrogen-doped silicon melt comprising silicon atoms and nitrogen atoms.

14 Claims, 10 Drawing Sheets

(56) References Cited

U.S. PATENT DOCUMENTS

| | | | |
|---|---|---|---|
| 2001/0015168 A1 | 8/2001 | Dietze et al. | |
| 2003/0159647 A1 | 8/2003 | Arvidson et al. | |
| 2004/0009111 A1 | 1/2004 | Haga et al. | |
| 2006/0254499 A1 | 11/2006 | Furukawa et al. | |
| 2009/0031161 A1* | 1/2009 | Weiberle | G06F 11/0751 714/2 |
| 2011/0192342 A1 | 8/2011 | Fukuda et al. | |
| 2012/0160156 A1 | 6/2012 | Kato et al. | |
| 2013/0189176 A1* | 7/2013 | Wochner | C01B 33/037 423/348 |
| 2013/0219967 A1* | 8/2013 | Hussy | C30B 11/002 65/157 |
| 2014/0077430 A1* | 3/2014 | Heo | F16F 9/38 267/292 |
| 2017/0253991 A1 | 9/2017 | Xiao et al. | |
| 2017/0253993 A1 | 9/2017 | Xiao et al. | |
| 2018/0016702 A1 | 1/2018 | Xiao et al. | |

FOREIGN PATENT DOCUMENTS

| | | | | |
|---|---|---|---|---|
| CN | 102409401 A | | 4/2012 | |
| CN | 105829246 A | * | 8/2016 | B01D 46/00 |
| CN | 107151818 A | | 9/2017 | |
| CN | 113818077 A | | 12/2021 | |
| DE | 102016115436 A1 | | 9/2017 | |
| JP | S60251190 A | | 12/1985 | |
| JP | 2006315869 A | | 11/2006 | |
| JP | 2011162367 A | | 8/2011 | |
| KR | 20070072670 A | | 7/2007 | |
| KR | 20090029775 A | | 3/2009 | |
| KR | 20120075387 A | | 7/2012 | |
| TW | 593799 B | | 6/2004 | |
| TW | 202113166 A | | 4/2021 | |
| WO | 2021050176 A1 | | 3/2021 | |

OTHER PUBLICATIONS

English Translation of Japanese Office Action corresponding to Japanese Application No. 2022-571858, dated Jul. 9, 2024. (2 pages).

Written Opinion and International Search Report of the International Search Authority corresponding to International Application No. PCT/CN2022/119905, dated Nov. 30, 2022. (10 pages).

English Translation of Written Opinion and International Search Report of the International Search Authority corresponding to International Application No. PCT/CN2022/119905, dated Nov. 30, 2022. (5 pages).

Chinese Office Action corresponding to Chinese Patent Application No. 202111115707.3 dated Apr. 24, 2022. (7 Pages).

English Translation of Chinese Office Action corresponding to Chinese Patent Application No. 202111115707.3 dated Apr. 24, 2022. (8 Pages).

Taiwanese Office Action corresponding to Taiwanese Patent Application No. 111129098 dated Mar. 31, 2023. (9 Pages).

English Translation of Taiwanese Office Action corresponding to Taiwanese Patent Application No. 111129098 dated Mar. 31, 2023. (4 Pages).

Machine English Translation of CN102409401A. (7 Pages), Apr. 11, 2012.

Li Ganqiang. Thermal Ceramic, Performance Test. Craftsmanship. Apr. 15, 2022. (3 Pages).

English Translation of Li Ganqiang. Thermal Ceramic, Performance Test. Craftsmanship. Apr. 15, 2022. (3 Pages).

Machine English Translation of CN113818077A. (15 Pages), Dec. 21, 2021.

Machine English Translation of CN102168312A. (7 Pages), Aug. 31, 2011.

Machine English Translation of TW202113166A. (32 Pages), Apr. 1, 2021.

Korean Office Action corresponding to Korean Application No. 10-2022-7041371, dated Jan. 30, 2024. (8 pages).

English Translation of Korean Office Action corresponding to Korean Application No. 10-2022-7041371, dated Jan. 30, 2024. (7 pages).

Machine English Translation of KR20070072670A. (13 Pages), Jul. 5, 2007.

Machine English Translation of JPS60251190A. (4 Pages), Dec. 11, 1985.

* cited by examiner

ACQUISITION EQUIPMENT AND METHOD FOR ACQUIRING NITROGEN-DOPED SILICON MELT AND MANUFACTURING SYSTEM OF NITROGEN-DOPED MONOCRYSTALLINE SILICON

CROSS-REFERENCE TO RELATED APPLICATIONS

This application is the U.S. national phase of PCT Application No. PCT/CN2022/119905 filed on Sep. 20, 2022, which claims a priority to Chinese Patent Application No. 202111115707.3 filed on Sep. 23, 2021, the disclosures of which are incorporated in their entirety by reference herein.

TECHNICAL FIELD

This disclosure relates to the field of semiconductor silicon wafer production, in particular to an acquisition equipment and method for acquiring nitrogen-doped silicon melt and a manufacturing system of nitrogen-doped monocrystalline silicon.

BACKGROUND

Silicon wafers used for producing semiconductor electronic components, such as integrated circuits, are mainly produced by slicing monocrystalline silicon ingots pulled by the Czochralski method. The Czochralski method includes melting polysilicon in a quartz crucible to acquire a silicon melt, immersing a monocrystalline seed into the silicon melt, and continuously pulling the seed to move away from the surface of the silicon melt, thereby a monocrystalline silicon ingot is grown at the phases-interface during pulling.

In the production process described above, it is advantageous to provide such a silicon wafer that has a Denuded Zone (DZ) extending into the body from the front surface and a Bulk Micro Defect (BMD) zone adjacent to the DZ and further extending into the body. The front surface refers to a surface of the silicon wafer on which electronic components are to be formed. The above-mentioned DZ is important, the reasons are as follows: in order to form electronic components on a silicon wafer, it is required that there is no crystal defect in the formation area of electronic components, otherwise it will lead to circuit breakage and other faults. Thus, the electronic components can be formed in the DZ to avoid the influence of crystal defects. The effect of the above BMD is that it can produce an Intrinsic Getter (IG) effect on metal impurities to keep metal impurities in silicon wafers away from the DZ. Thus, the adverse effects such as the increase of leakage current and the reduction of gate oxide film quality caused by metal impurities can be avoided.

In the process of producing the above-mentioned silicon wafers with BMD zones, it is advantageous to dope silicon wafers with nitrogen. For example, in the case of a silicon wafer doped with nitrogen, it is possible to promote the formation of BMD with nitrogen as the core, so that the BMD can reach a certain density and effectively play a role as a source for absorbing metal impurities. Moreover, it also has a beneficial effect on the density distribution of the BMD, such as making the density of the BMD more uniformly distributed in the radial direction of the silicon wafer, for another example, making the density of the BMD higher in the region adjacent to the DZ and gradually decreasing toward the silicon wafer body, etc.

As a method of doping silicon wafers with nitrogen, the silicon melt in the quartz crucible can be doped with nitrogen, and the monocrystalline silicon ingots pulled therefrom and the silicon wafers cut from monocrystalline silicon ingots will be doped with nitrogen.

FIG. 1 shows an illustration of a current embodiment of doping silicon melt with nitrogen. As shown in FIG. 1, the polysilicon feedstock blocks B1 are housed together with the silicon nitride blocks B2 in, for example, a quartz crucible (QC). The polysilicon feedstock blocks B1 are shown schematically by a larger area surrounded by a wire frame and the silicon nitride blocks B2 are shown schematically by a smaller area filled with black. The silicon nitride blocks B2 are first placed into the quartz crucible QC and are located at the bottom of the quartz crucible QC, and then the polysilicon feedstock blocks B1 are placed into the quartz crucible QC and are located above the silicon nitride blocks B2 and at the upper part of the quartz crucible QC. When the quartz crucible QC is heated to melt the polysilicon feedstock blocks B1 and the silicon nitride blocks B2 housed in the quartz crucible QC, a melt comprising silicon atoms and nitrogen atoms is acquired, i.e., a nitrogen-doped silicon melt M. However, in the above embodiment, the nitrogen atoms from silicon nitride blocks B2 cannot be fully dissolved in the whole melt and can only be dissolved in a certain range around each silicon nitride block B2, thus the distribution of doped nitrogen in the whole melt is not uniform. Specifically, the acquired melt can be roughly classified into three regions according to the nitrogen concentration or nitrogen content as follows: a first melt region M1 with low nitrogen content, as shown schematically in FIG. 1 by the low-density dot-filled region, which is located in the quartz crucible QC at the position of the polysilicon feedstock blocks B1; a second melt region M2 with medium nitrogen content, as shown schematically in FIG. 1 by the medium-density dot-filled region, which is located in the quartz crucible QC at the transition area of the polysilicon feedstock blocks B1 and the silicon nitride blocks B2; and a third melt region M3 with high nitrogen content, as shown schematically in FIG. 1 by a high-density dot-filled region, which is located in the quartz crucible QC at the position of the silicon nitride blocks B2.

FIG. 2 shows another embodiment of the doping silicon melt with nitrogen which improves the uniformity of the distribution of the doped nitrogen in the whole melt. The difference from the embodiment shown in FIG. 1 is that in FIG. 2, for the polysilicon feedstock blocks B1 and silicon nitride blocks B2 housed in the quartz crucible QC, the silicon nitride blocks B2 are uniformly distributed in the polysilicon feedstock blocks B1, which can be achieved, for example, by placing the polysilicon feedstock blocks B1 and silicon nitride blocks B2 into the quartz crucible QC in batches in an alternating manner or, for example, by stirring the polysilicon feedstock blocks B1 and silicon nitride blocks B2 housed in the quartz crucible QC as shown in FIG. 1. Compared with FIG. 1, it can be seen that the distribution uniformity of nitrogen in the acquired melt in FIG. 2 is better. However, the embodiment illustrated in FIG. 2 still has the problem of "local non-uniformity" of nitrogen concentration. Specifically, referring to FIG. 2, the acquired melt can be roughly classified into three regions according to the nitrogen concentration or nitrogen content as follows: a first melt region M1 with low nitrogen content, as shown schematically in FIG. 2 by the low-density dot-filled region, which is located in the quartz crucible QC at a position having a long distance from the geometrical center of the silicon nitride blocks B2; a second melt region M2 with medium nitrogen content, as shown schematically in FIG. 2 by the medium-density dot-filled region, which is located in the quartz crucible QC at a position having a medium distance from the geometric center of the silicon nitride blocks B2; and a third melt region M3 with high nitrogen content, as shown schematically in FIG. 2 by a high-density dot-filled region, which is located in the quartz crucible QC at a position having a close distance from the geometric center of the silicon nitride blocks B2.

The nitrogen doping technical solutions described above all have the problem of un-uniform distribution of the doped nitrogen in the whole melt to varying degrees, resulting in un-uniform nitrogen concentrations in the monocrystalline silicon ingots pulled from such a melt and in the silicon wafers cut from the monocrystalline silicon ingots, making it impossible to acquire the desired density distribution of BMD or to control the density distribution of BMD effectively, which adversely affects the Intrinsic Getter effect as a favorable factor.

SUMMARY

In order to solve the above technical problems, embodiments of the present disclosure provide an acquisition equipment and a method for acquiring a nitrogen-doped silicon melt, and a system for manufacturing a nitrogen-doped monocrystalline silicon, which solve the problem of un-uniform nitrogen concentration in nitrogen-doped silicon melt, make the density distribution of BMD in silicon wafer be effectively controlled, and thus play a good role in Intrinsic Getter effect.

The technical solutions of the present disclosure are as follows.

In a first aspect, embodiments of the present disclosure provide an acquisition equipment for acquiring a nitrogen-doped silicon melt, the acquisition equipment comprising:

- a granulation apparatus which is configured to prepare a plurality of polysilicon particles with uniform particle sizes using polysilicon feedstock blocks;
- a reaction apparatus which is configured to enable the plurality of polysilicon particles and nitrogen gas to be subjected to a chemical reaction to obtain a plurality of reaction particles, wherein silicon nitride is formed in a surface layer of each of the plurality of polysilicon particles by the chemical reaction such that each of the plurality of reaction particles includes a polysilicon core and a silicon nitride coating on the polysilicon core; and
- a melting apparatus which is configured to melt the plurality of reaction particles to acquire the nitrogen-doped silicon melt comprising silicon atoms and nitrogen atoms.

In a second aspect, embodiments of the present disclosure provide an acquisition method for acquiring a nitrogen-doped silicon melt which is implemented according to the acquisition equipment described in the first aspect, the acquisition method comprising:

- preparing a plurality of polysilicon particles with uniform particle sizes using polysilicon feedstock blocks;
- subjecting the plurality of polysilicon particles and nitrogen gas to a chemical reaction to acquire a plurality of reaction particles, wherein silicon nitride is formed in a surface layer of each of the plurality of polysilicon particles by the chemical reaction such that each of the plurality of reaction particles comprises a polysilicon core and a silicon nitride coating on the polysilicon core; and
- melting the plurality of reaction particles to acquire the nitrogen-doped silicon melt comprising silicon atoms and nitrogen atoms.

In a third aspect, embodiments of the present disclosure provide a system for manufacturing nitrogen-doped monocrystalline silicon, the system comprises:

- the acquisition equipment according to the first aspect: and
- a crystal pulling apparatus which is configured to pull monocrystalline silicon ingots using the nitrogen-doped silicon melt by the Czochralski method.

Embodiments of the present disclosure provide an acquisition equipment and a method for acquiring a nitrogen-doped silicon melt, and a system for manufacturing a nitrogen-doped monocrystalline silicon. Although nitrogen atoms from the silicon nitride coating are likewise only able to be dissolved in a certain range around the silicon nitride coating, due to the silicon nitride coating is uniformly formed outside the polysilicon core, when a large number of reaction particles are melted in a stacked manner, it is possible to make the nitrogen atoms from the silicon nitride coating of all reaction particles can be dissolved more uniformly in the whole melt compared to the related technology. Even after constructing the appropriate size of the polysilicon core and thickness of the silicon nitride coating according to the size of the range around which the nitrogen atoms from the silicon nitride coating can be dissolved in the silicon nitride coating, it is possible to achieve complete uniform dissolution of the nitrogen atoms in the whole melt, so that the distribution of the doped nitrogen in the whole melt is more uniform for the acquired nitrogen-doped silicon melt, or the consistency of the nitrogen concentration at different areas of the melt is better compared to the related technology.

DETAILED DESCRIPTION

The technical solutions according to embodiments of the present disclosure will be described hereinafter in conjunction with the drawings in the embodiments of the present disclosure in a clear and complete manner.

Figure 1:
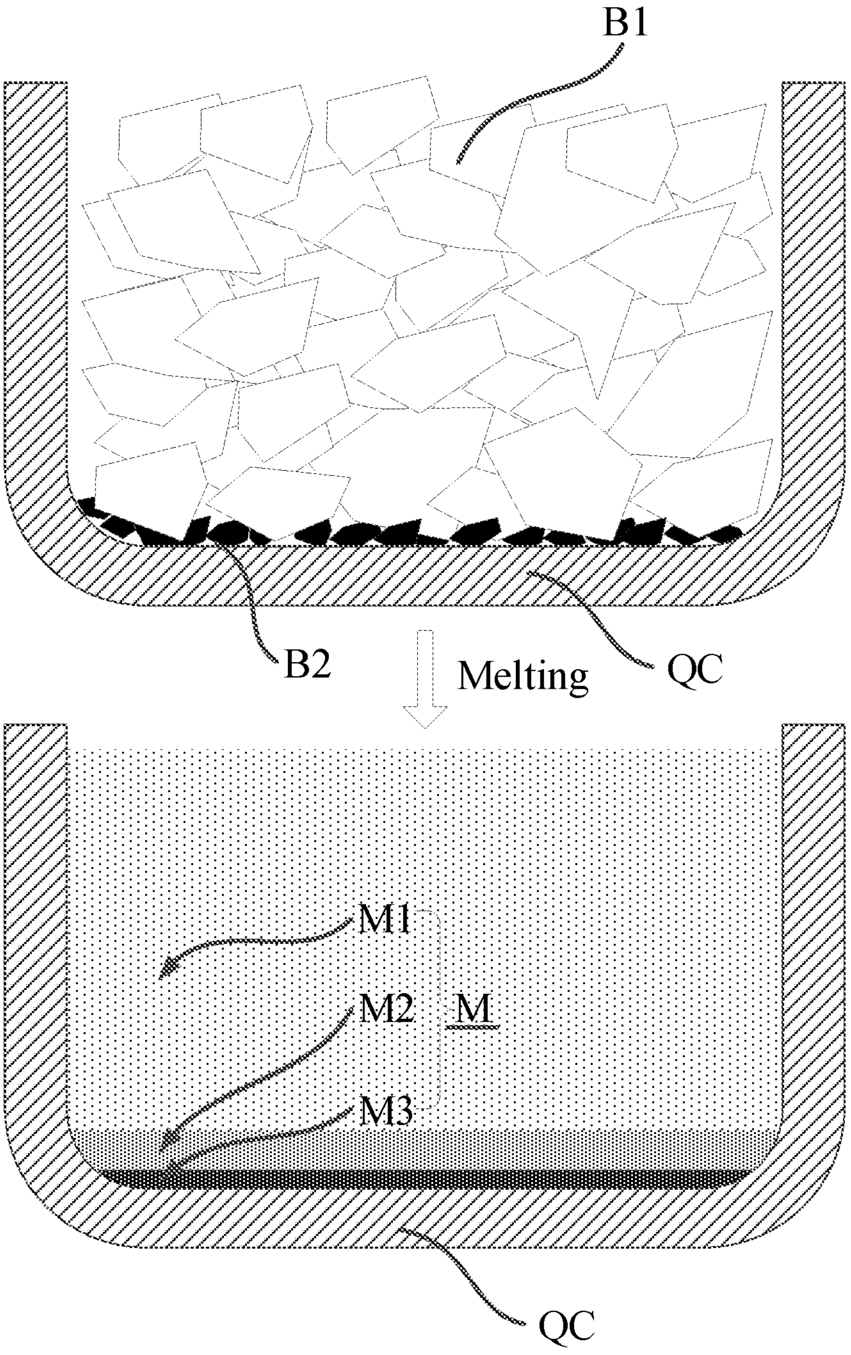
FIG. 1 is a schematic diagram of an embodiment of the related technology in which the silicon melt is doped with nitrogen.
Figure 2:
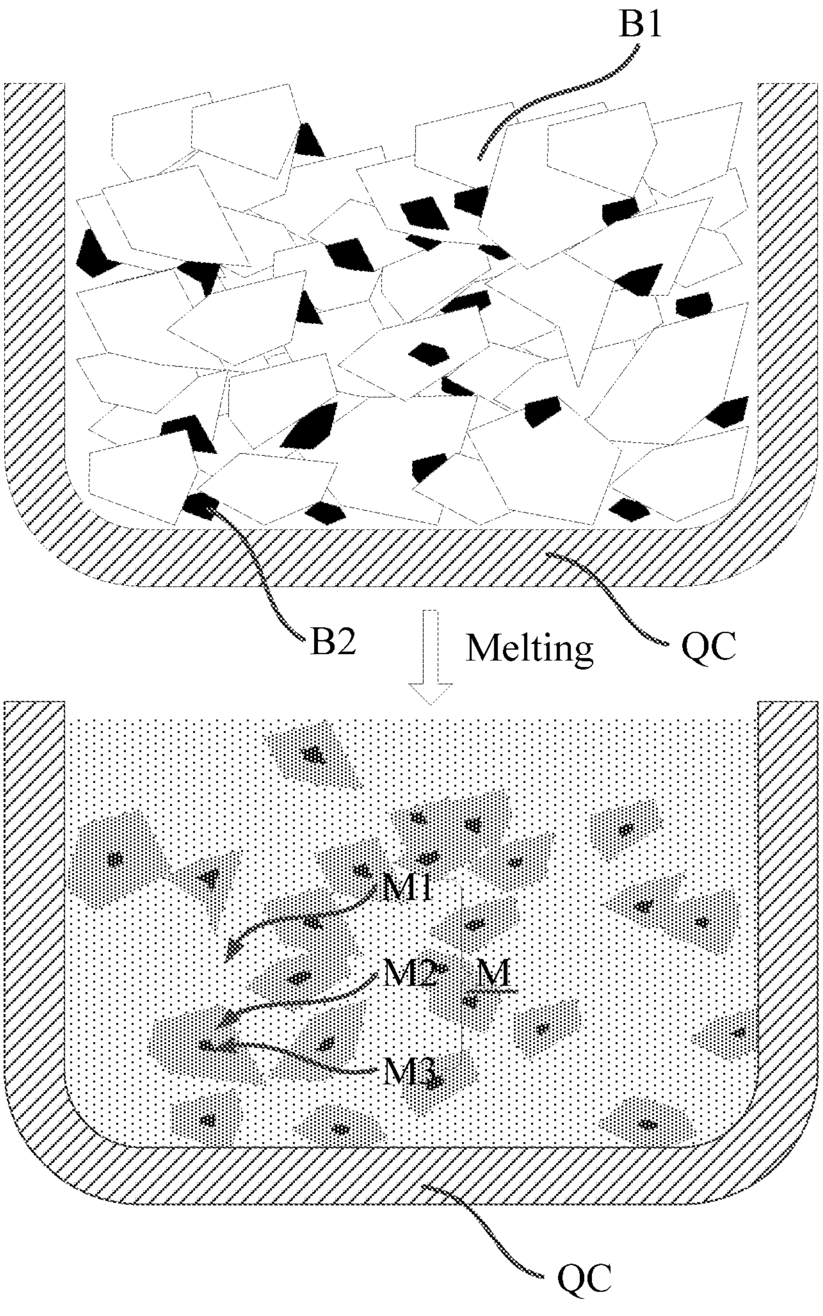
FIG. 2 is a schematic diagram of another embodiment of the related technology in which the silicon melt is doped with nitrogen.
Figure 3:
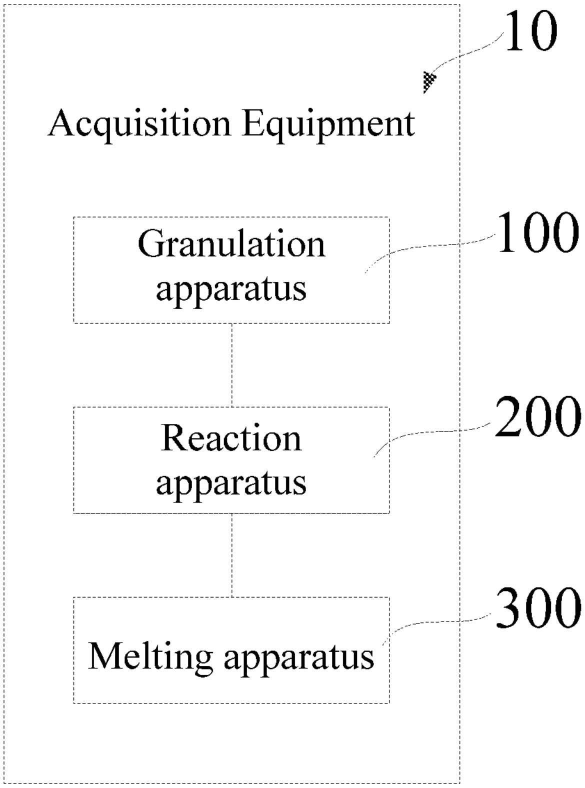
FIG. 3 is a schematic diagram of the components of an acquisition equipment for acquiring the nitrogen-doped silicon melt according to an embodiment of the present disclosure.
Figure 4:
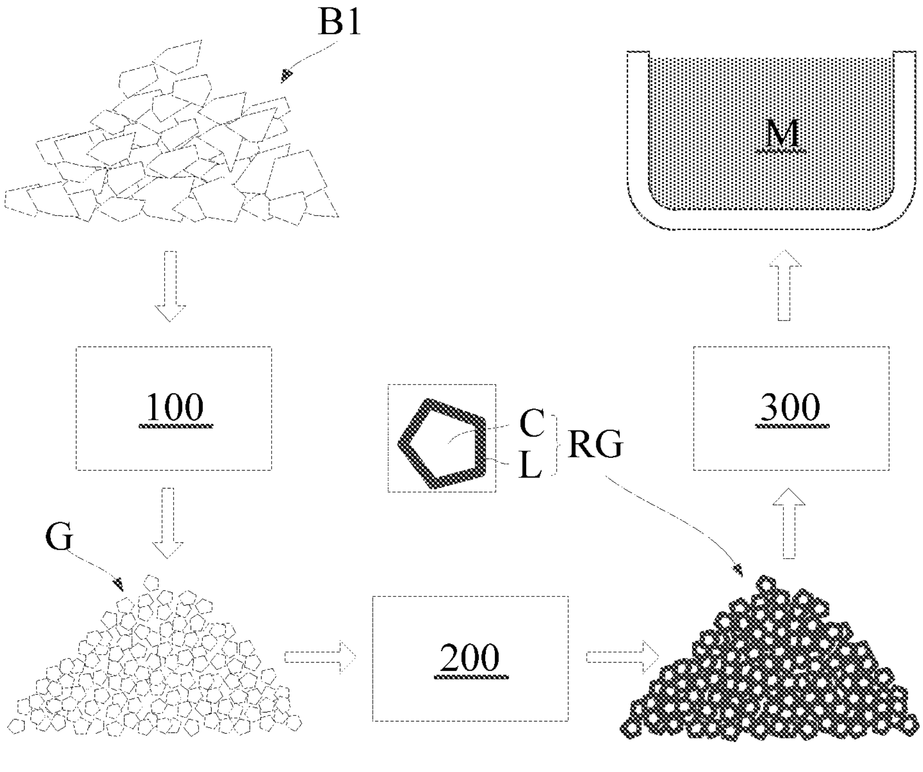
FIG. 4 is a schematic diagram of the conversion processes of converting polysilicon feedstock blocks into polysilicon particles, polysilicon particles into reaction particles, and reaction particles into a melt, according to an embodiment of the present disclosure.

Referring to FIG. 3 and FIG. 4, an embodiment of the present disclosure provides an acquisition equipment 10 for acquiring a nitrogen-doped silicon melt M, the acquisition equipment 10 may comprise the following apparatuses.

A granulation apparatus 100, which is configured to prepare a plurality of polysilicon particles G with uniform particle sizes by polysilicon feedstock blocks B1. Such granulation apparatus 100 is known in the relevant technology, such as a granulation apparatus includes a crushing pelleting machine and a screening machine. The crushing pelleting machine can crush the polysilicon feedstock blocks B1 to break the larger polysilicon feedstock blocks B1 into polysilicon particles with a smaller volume, and the screening machine can select particles with desired particle sizes from the polysilicon particles with a smaller volume.

A reaction apparatus 200, which is configured to enable the plurality of polysilicon particles G and nitrogen gas ($N_2$) to be subjected to a chemical reaction to acquire a plurality of reaction particles RG, wherein silicon nitride ($Si_3N_4$) is formed in a surface layer of each of the plurality of polysilicon particles G by the chemical reaction such that each of the plurality of reaction particles RG comprises a polysilicon core C and a silicon nitride coating L which coated the polysilicon core C, as illustrated in detail in FIG. 4 by means of an enlarged schematic view of the individual reaction particles RG in the dashed box. In addition, the embodiments of the specific components and structure of the reaction apparatus 200 will be described in detail below.

Figure 5:
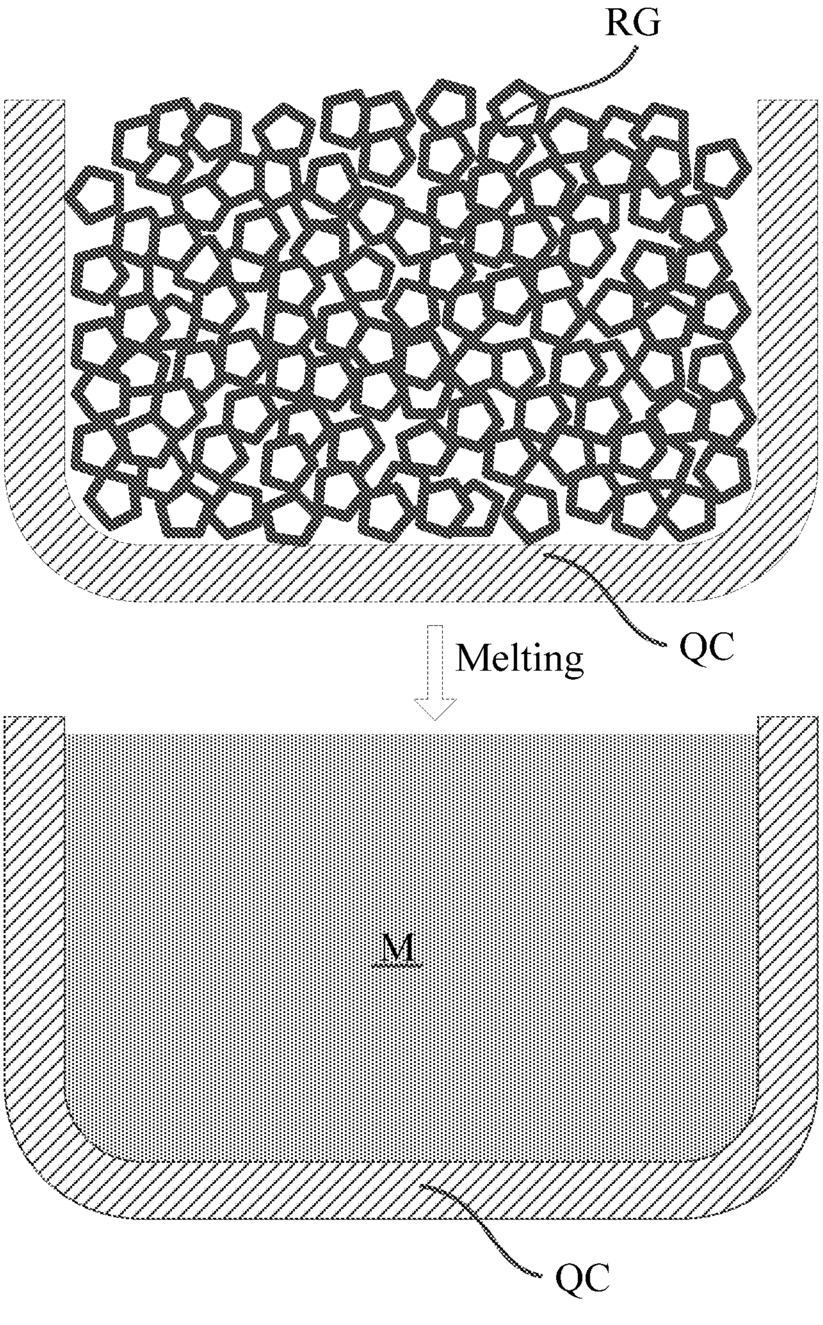
FIG. 5 is a schematic diagram of accommodating reaction particles in a quartz crucible to perform the melting process according to embodiments of the present disclosure.

A melting apparatus 300, which is configured to melt the plurality of reaction particles RG to acquire the nitrogen-doped silicon melt M comprising silicon atoms and nitrogen atoms. The melting apparatus 300 may be an apparatus in a conventional crystal puller, which includes a quartz crucible, a heater, and other components associated with melting the polysilicon feedstock blocks, in a conventional crystal puller such as a quartz crucible, a heater, etc.; or may be a separate apparatus not belonging to a crystal puller. FIG. 5 shows a schematic diagram of the plurality of reaction particles (RG) being housed in a quartz crucible QC of a crystal puller (not shown in detail in drawings) to perform the melting described above.

For the acquisition equipment 10 according to the present disclosure, although the nitrogen atoms from the silicon nitride coating L are likewise only able to dissolve in a certain range around the silicon nitride coating L, due to the silicon nitride coating L is uniformly formed outside the polysilicon core C, as shown in FIG. 5, when the quartz crucible QC is heated to melt all reaction particles RG contained in the quartz crucible QC, it is possible to make the nitrogen atoms from the silicon nitride coating L of all reaction particles RG can be dissolved more uniformly in the whole melt compared to the related technology. Even after acquiring the appropriate size of the polysilicon core C and thickness of the silicon nitride coating L according to a certain range around which the nitrogen atoms from the silicon nitride coating L can be dissolved in the silicon nitride coating L, it is possible to achieve complete uniform dissolution of the nitrogen atoms in the whole melt, so that the distribution of the doped nitrogen in the whole melt is more uniform for the acquired nitrogen-doped silicon melt M, or the consistency of the nitrogen concentration at different areas of the melt is better.

The size of the plurality of polysilicon particles G is important, and it is understood that the smaller the particle size, the easier it is to achieve a uniform distribution of nitrogen atoms in the nitrogen-doped silicon melt M. However, if the particle size is too small, when the plurality of polysilicon particles G are stacked together to react with nitrogen gas, it will result in the polysilicon particles G that are inside the stack not being able to make sufficient contact with the nitrogen gas and affect the generation of silicon nitride, or it will result in not being able to generate silicon nitride in the surfaces of the plurality of polysilicon particles G in a consistent manner. In this way, when the plurality of polysilicon particles G is melted, it is still not possible to acquire a melt with a uniform distribution of nitrogen atoms. On the other hand, smaller particle sizes result in higher process control requirements for the actual growth of monocrystalline silicon, while larger particle sizes result in higher costs. In view of this, in an optional embodiments of the present disclosure, the granulation apparatus 100 can be configured to acquire particles with uniform sizes between 5 mm and 20 mm, or in another words, in an optional embodiments of the present disclosure, the uniform particles sizes of the plurality of polysilicon particles G can be between 5 mm and 20 mm, so as to enable each polysilicon particle G to be in fully contact with nitrogen gas and to achieve a uniform distribution of nitrogen atoms in the acquired melt and to reduce control requirements as well as costs. It is understood that polysilicon particles G are not necessarily spherical, and therefore the size of a single polysilicon particle G may be different in different directions, so it should be noted that the above “particle size” refers to the maximum value of the size in any direction for each polysilicon particle G.

It is also understood that the control of the total amount of doped nitrogen can be achieved by variables such as reaction temperature, introduced amount of nitrogen and reaction time, and the smaller the above-mentioned uniform particle size, the greater the total amount of acquired doped nitrogen under the condition that the above variables are equal. For the amount of doped nitrogen that can have a beneficial effect on the density of the BMD, from 20 g to 200 g of silicon nitride can be doped in every 410 kg of polysilicon feedstock. In order to know the amount of doped nitrogen, the above-mentioned reaction apparatus 200 can be equipped with a weigher to acquire the weight of the plurality of polysilicon particles G and to monitor the total weight of the plurality of reaction particles RG in real time, thereby acquiring the mass of the produced silicon nitride as well as the amount of doped nitrogen. It can interrupt the above-mentioned chemical reaction when the amount of doped nitrogen meets the requirements.

Figure 6:
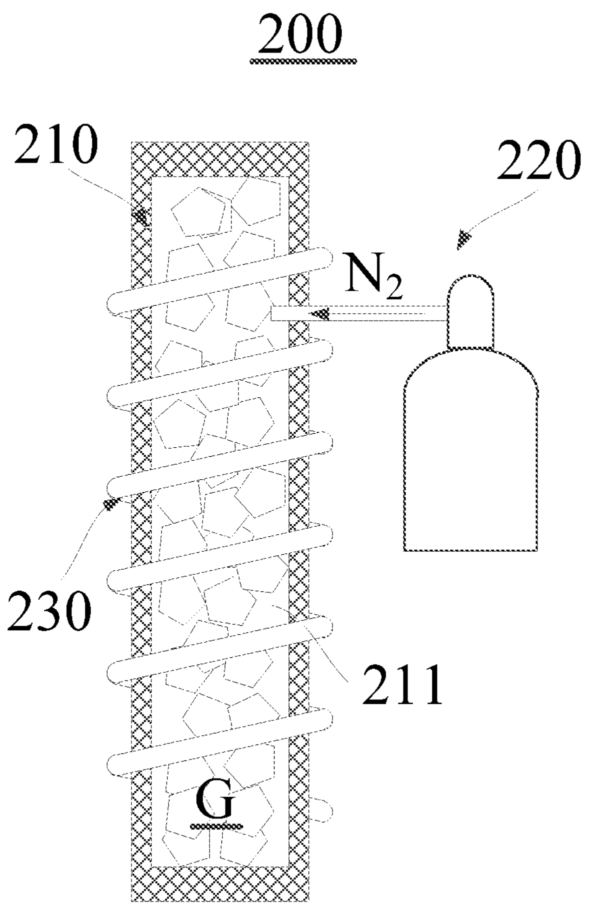
FIG. 6 is a schematic diagram of the components and the structure of the reaction apparatus according to an embodiment of the present disclosure.

The reaction apparatus 200 according to an embodiment of the present disclosure is described in detail below. Referring to FIG. 6, the reaction apparatus 200 may comprise: a container 210, which has a chamber 211 for holding the plurality of polysilicon particles G; a nitrogen gas supply 220, which is configured to supply nitrogen gas into the chamber 211, as schematically illustrated by arrows in FIG. 6; and a heater 230, which is configured to heat the container 210 to provide high temperature, for example between 800° C. and 1100° C., in the chamber 211, to react the polysilicon with the nitrogen gas to form silicon nitride. As illustrated in FIG. 6, the heater 230 is optionally a thermal resistance wire wrapped around the periphery of the container 210, and then providing uniformly high temperature throughout the chamber 211 is achieved; or the heater 230 is optionally a thermal resistance wire wrapped around the periphery of the container 210 may be a microwave heater, which is not shown in detail in the drawings.

Figure 7:
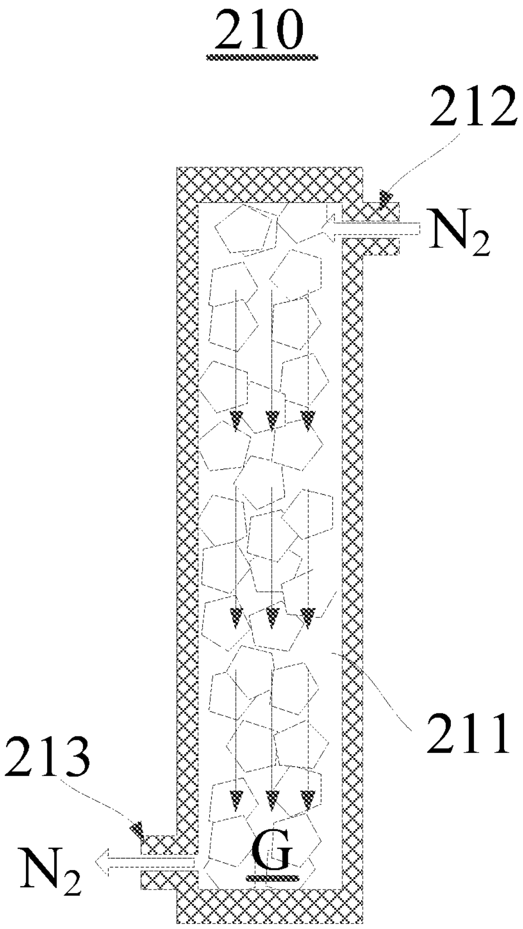
FIG. 7 is a schematic diagram of the components and the structure of the container according to an embodiment of the present disclosure.

In the case of the plurality of polysilicon particles G stacked together, in order to achieve the generation of silicon nitride in the surface of each polysilicon particle G, as shown in FIG. 7, the chamber 211 may be in the form of an elongated tube, the container 210 may also have an inlet 212 and an outlet 213 arranged respectively at two longitudinal ends of the chamber 211, and the nitrogen gas supply 220, as illustrated in FIG. 6, is constructed to continuously supply nitrogen gas into the chamber 211 via the inlet 212, as illustrated schematically by the hollow arrow at the inlet 212 in FIG. 7, the nitrogen gas flows through the chamber 211, as illustrated schematically by the solid arrow inside the chamber 211 in FIG. 7, and exits via the outlet 213, as illustrated schematically by the hollow arrow at the outlet 213 in FIG. 7. In this way, each polysilicon particle G is located in the flow path of nitrogen gas, thus allowing each polysilicon particle G to come into full contact with the nitrogen gas to react. Optionally, the flow rate of nitrogen gas supplied to the chamber 211 may be between 1 L/min and 200 L/min.

In an optional embodiment of the present disclosure, the container 210 may be made of quartz capable of withstanding the high temperature environment of the chemical reaction described above.

In order to avoid the introduction of impurities during the chemical reaction described above, in an optional embodiment of the present disclosure, the nitrogen gas supply 220 as illustrated in FIG. 6 may be supply nitrogen gas with a purity of no less than 99.99%.

Figure 8:
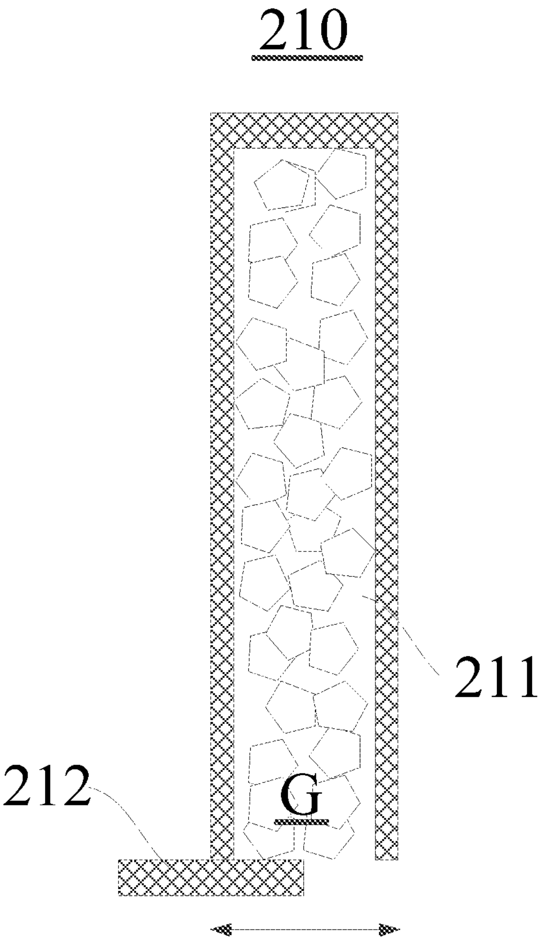
FIG. 8 is a schematic diagram of the components and the structure of the container according to another embodiment of the present disclosure.

Referring to FIG. 8, in an optional embodiment of the present disclosure, the container 210 has a movable baffle 212 for opening the bottom. In the case where the container 210 is set with the bottom facing downward and for example, above the quartz crucible QC of crystal puller, when the movable baffle 212 is moved to the left in the direction of the arrow shown in FIG. 8, the bottom of the container 210 can be opened, so that the polysilicon particles G contained in the chamber 211 automatically fall into the quartz crucible QC under the action of gravity, to achieve the rapid release of the polysilicon particles G, and to avoid the container 210 staying above the quartz crucible QC for a long period of time and pollution of crucible chamber. When the movable baffle 212 is moved to the right in the direction of the arrow shown in FIG. 8, the container 210 can be closed so that the polysilicon particles G are kept in the chamber 211.

Figure 9:
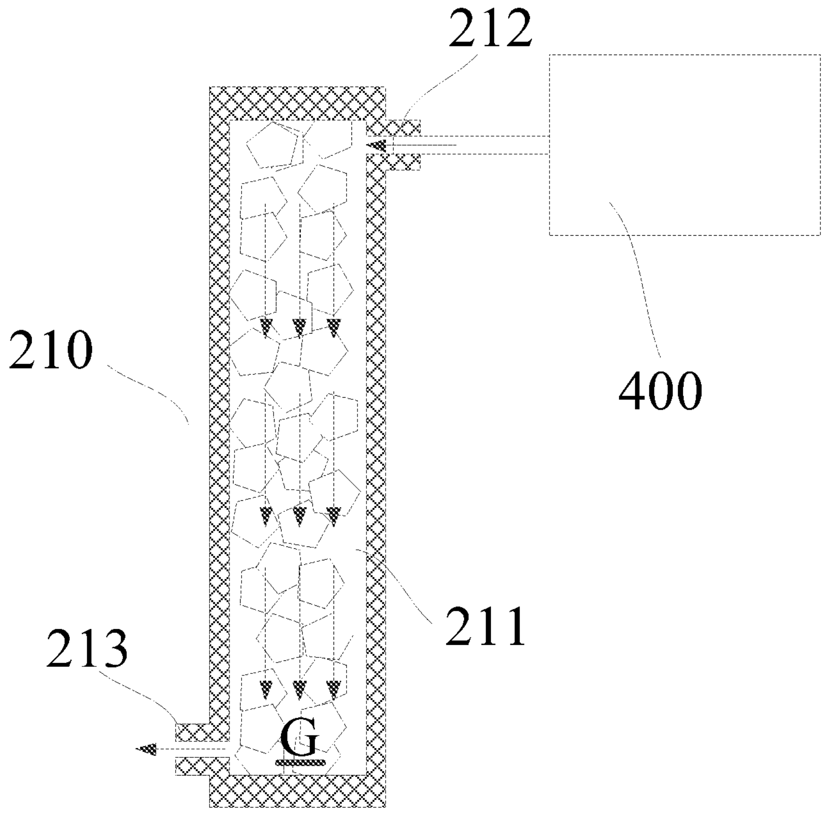
FIG. 9 is a schematic diagram of some components of an acquisition equipment for acquiring a nitrogen-doped silicon melt according to another embodiment of the present disclosure.

In optional embodiments of the present disclosure, see FIG. 9, the acquisition equipment 10 may further comprise a purging apparatus 400. The purging apparatus 400 is configured to purge the plurality of polysilicon particles G using a protective gas such as argon prior to occurrence of the chemical reaction, to remove residual moisture and/or residual chemical impurities from the surface of each polysilicon particle G. An optional embodiment of the purging apparatus 400 is shown in FIG. 9, where the purging apparatus 400 can purge the polysilicon particles G via the inlet 212 while the polysilicon particles G are contained in the chamber 211 of the container 210 shown in FIG. 7. The flow direction of the protective gas is shown by the solid arrows in FIG. 7, and the chemical reaction can be carried out directly after the purging is completed. This avoids need for additional transfer of the polysilicon particles G and thus the contamination of polysilicon particles G is avoided to the greatest extent.

Figure 10:
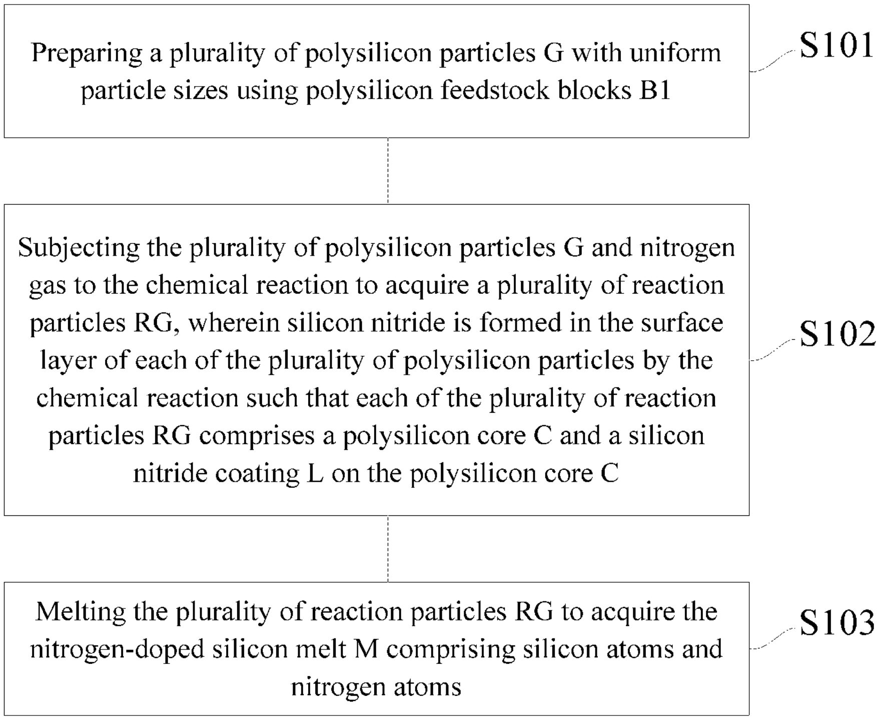
FIG. 10 is a schematic diagram of a method for acquiring a nitrogen-doped silicon melt according to an embodiment of the present disclosure.

Referring to FIG. 10, embodiments of the present disclosure further provide a method of acquiring a nitrogen-doped silicon melt M, the method may comprise: S101: preparing a plurality of polysilicon particles G with uniform particle sizes using polysilicon feedstock blocks B1; S102: subjecting the plurality of polysilicon particles G and nitrogen gas to the chemical reaction to acquire a plurality of reaction particles RG, wherein silicon nitride is formed in the surface layer of each of the plurality of polysilicon particles by the chemical reaction such that each of the plurality of reaction particles RG comprises a polysilicon core C and a silicon nitride coating L on the polysilicon core C; and S103: melting the plurality of reaction particles RG to acquire the nitrogen-doped silicon melt M comprising silicon atoms and nitrogen atoms.

Figure 11:
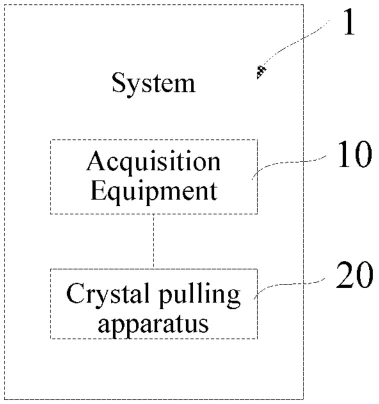
FIG. 11 is a schematic diagram of components of a system for manufacturing nitrogen-doped monocrystalline silicon according to an embodiment of the present disclosure.

Referring to FIG. 11, embodiments of the present disclosure also provide a system 1 for manufacturing nitrogen-doped monocrystalline silicon, the system 1 may comprise: the acquisition equipment 10 according to this disclosure; and a crystal pulling apparatus 20, which is configured to pull monocrystalline silicon ingots using the nitrogen-doped silicon melt M by the Czochralski method.

It should be noted that the above-mentioned crystal pulling apparatus 20 can be an apparatus such as a draft tube, pulling mechanism, etc. in a crystal puller that is associated with the components used for pulling monocrystalline silicon ingots, and that in the case where the melting apparatus 300 of the acquisition equipment 10 is an apparatus such as quartz crucible, heater, etc. in the above-mentioned crystal puller constituted with components associated with melting polysilicon feedstock blocks, the melting apparatus 300 and the crystal pulling apparatus 20 in this disclosure can be realized in the same conventional crystal puller.

It should be noted that the technical solutions described in the embodiments of this disclosure can be combined with each other in any way without conflict.

The above description is merely the specific embodiment of the present disclosure, but the scope of the present disclosure is not limited thereto. Moreover, any person skilled in the art would readily conceive of modifications or substitutions within the technical scope of the present disclosure, and these modifications or substitutions shall also fall within the protection scope of the present disclosure. Therefore, the protection scope of the present disclosure should be determined by the scope of the claims.

What is claimed is:

1. Acquisition equipment for acquiring a nitrogen-doped silicon melt, the acquisition equipment comprising:

a granulation apparatus configured to prepare a plurality of polysilicon particles with uniform particle sizes using polysilicon feedstock blocks;

a reaction apparatus configured to enable the plurality of polysilicon particles and nitrogen gas to be subjected to a chemical reaction to acquire a plurality of reaction particles, wherein silicon nitride is formed in a surface layer of each of the plurality of polysilicon particles by the chemical reaction such that each of the plurality of reaction particles comprises a polysilicon core and a silicon nitride coating on the polysilicon core; and a melting apparatus configured to melt the plurality of reaction particles to acquire the nitrogen-doped silicon melt comprising silicon atoms and nitrogen atoms, wherein the reaction apparatus comprises: a container having a chamber for holding the plurality of polysilicon particles; a nitrogen gas supply configured to supply nitrogen gas into the chamber; and a heater configured to heat the container, and wherein the container has a bottom and further comprises a movable baffle for opening the bottom.

2. The acquisition equipment according to claim 1, wherein the plurality of polysilicon particles have uniform particle sizes between 5 mm and 20 mm.

3. The acquisition equipment according to claim 1, wherein:

the chamber is in a form of an elongated tube;

the container has an inlet and an outlet arranged respectively at two longitudinal ends of the chamber; and the nitrogen gas supply is configured to continuously supply nitrogen gas into the chamber via the inlet, so that the nitrogen gas flows through the chamber and exits via the outlet.

4. The acquisition equipment according to claim 1, wherein the container is constructed of quartz.

5. The acquisition equipment according to claim 1, wherein the nitrogen gas supply supplies nitrogen gas with a purity of at least 99.99%.

6. The acquisition equipment according to claim 1, further comprising a purging apparatus configured to purge the plurality of polysilicon particles with protective gas prior to occurrence of the chemical reaction in order to remove residual moisture and/or residual chemical impurities from the surface of each of the plurality of polysilicon particles.

7. An acquisition method for acquiring nitrogen-doped silicon melt which is implemented by applying the acquisition equipment according to claim 1, the acquisition method comprising:

preparing the plurality of polysilicon particles with uniform particle sizes using polysilicon feedstock blocks;

subjecting the plurality of polysilicon particles and nitrogen gas to the chemical reaction to acquire the plurality of reaction particles, wherein silicon nitride is formed in the surface layer of each of the plurality of polysilicon particles by the chemical reaction such that each of the plurality of reaction particles comprises a polysilicon core and a silicon nitride coating on the polysilicon core; and melting the plurality of reaction particles to acquire the nitrogen-doped silicon melt comprising silicon atoms and nitrogen atoms.

8. The acquisition method according to claim 7, wherein:

the chamber is in a form of an elongated tube;

the container has an inlet and an outlet arranged respectively at two longitudinal ends of the chamber; and the nitrogen gas supply is configured to continuously supply nitrogen gas into the chamber via the inlet, so that the nitrogen gas flows through the chamber and exits via the outlet.

9. The acquisition method according to claim 7, wherein the container is constructed of quartz.

10. The acquisition method according to claim 7, wherein the acquisition equipment further comprises a purging apparatus configured to purge the plurality of polysilicon particles with protective gas prior to subjecting the plurality of polysilicon particles and nitrogen gas to the chemical reaction in order to remove residual moisture and/or residual chemical impurities from the surface of each of the plurality of polysilicon particles.

11. A system for manufacturing nitrogen-doped monocrystalline silicon, the system comprising:

the acquisition equipment according to claim 1; and a crystal pulling apparatus configured to pull monocrystalline silicon ingots using the nitrogen-doped silicon melt by the Czochralski method.

12. The system according to claim 11, wherein:

the chamber is in a form of an elongated tube;

the container has an inlet and an outlet arranged respectively at two longitudinal ends of the chamber; and the nitrogen gas supply is configured to continuously supply nitrogen gas into the chamber via the inlet, so that the nitrogen gas flows through the chamber and exits via the outlet.

13. The system according to claim 11, wherein the container is constructed of quartz.

14. The system according to claim 11, wherein the acquisition equipment further comprises a purging apparatus which is configured to purge the plurality of polysilicon particles with protective gas prior to occurrence of the chemical reaction, to remove residual moisture and/or residual chemical impurities from the surface of each of the plurality of polysilicon particles.

* * * * *